(12) United States Patent
Arai

(10) Patent No.: US 8,604,334 B2
(45) Date of Patent: Dec. 10, 2013

(54) PHOTOELECTRIC CONVERSION DEVICE

(75) Inventor: Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 285 days.

(21) Appl. No.: 12/551,814

(22) Filed: Sep. 1, 2009

(65) Prior Publication Data

US 2010/0059099 A1 Mar. 11, 2010

(30) Foreign Application Priority Data

Sep. 5, 2008 (JP) ................................ 2008-229103

(51) Int. Cl.
*H01L 31/05* (2006.01)
*H01L 31/042* (2006.01)
*H01L 31/18* (2006.01)

(52) U.S. Cl.
USPC ............. 136/249; 136/244; 257/443; 257/53; 257/E21.088; 438/80; 438/98; 438/73; 438/57

(58) Field of Classification Search
USPC ............ 136/249, 244; 257/443, 53, E21.088; 438/80, 98, 73, 57
See application file for complete search history.

(56) References Cited

U.S. PATENT DOCUMENTS

| 4,262,411 | A |   | 4/1981  | Jordan et al.   |         |
|-----------|---|---|---------|-----------------|---------|
| 4,428,110 | A |   | 1/1984  | Kim             |         |
| 4,517,403 | A |   | 5/1985  | Morel et al.    |         |
| 4,594,471 | A | * | 6/1986  | Yamazaki        | 136/249 |
| 4,697,041 | A |   | 9/1987  | Okaniwa et al.  |         |
| 4,724,011 | A |   | 2/1988  | Turner et al.   |         |
| 4,746,618 | A | * | 5/1988  | Nath et al.     | 438/62  |
| 4,786,607 | A | * | 11/1988 | Yamazaki et al. | 438/80  |
| 4,826,777 | A | * | 5/1989  | Ondris          | 438/80  |
| 4,857,115 | A | * | 8/1989  | Iwamoto et al.  | 136/249 |
| 4,872,925 | A | * | 10/1989 | McMaster        | 136/244 |
| 4,880,664 | A | * | 11/1989 | O'Dowd et al.   | 427/109 |
| 4,968,354 | A |   | 11/1990 | Nishiura et al. |         |
| 5,133,809 | A |   | 7/1992  | Sichanugrist et al. |     |
| 5,296,043 | A | * | 3/1994  | Kawakami et al. | 136/244 |
| 5,567,249 | A |   | 10/1996 | Yamazaki        |         |
| 5,593,901 | A |   | 1/1997  | Oswald et al.   |         |
| 5,733,382 | A | * | 3/1998  | Hanoka          | 136/251 |
| 6,080,928 | A |   | 6/2000  | Nakagawa        |         |

(Continued)

FOREIGN PATENT DOCUMENTS

EP   1 463 105 A2   9/2004
JP   54-041686 A    4/1979

(Continued)

*Primary Examiner* — Golam Mowla
(74) *Attorney, Agent, or Firm* — Fish & Richardson P.C.

(57) ABSTRACT

An object of the present invention is to provide a simple process to manufacture a wiring connecting photoelectric cells in a photoelectric conversion device. Another object of this invention is to prevent defective rupture from occurring in the said wiring. The photoelectric conversion device comprises a first and a second photoelectric conversion cells comprising respectively a first and a second single crystal semiconductor layers. First electrodes are provided on the downwards surfaces of the first and second photoelectric conversion cells, and second electrodes are provided on their upwards surfaces. The first and second photoelectric conversion cells are fixed onto a support substrate side by side. The second single crystal semiconductor layer has a through hole which reaches the first electrode. The second electrode of the first photoelectric conversion cell is extended to the through hole to be electrically connected to the first electrode of the second photoelectric conversion cell.

19 Claims, 11 Drawing Sheets

(56) References Cited

U.S. PATENT DOCUMENTS

| | | | |
|---|---|---|---|
| 6,268,235 B1* | 7/2001 | Sakakura et al. | 438/62 |
| 7,244,990 B2 | 7/2007 | Takafuji et al. | |
| 7,919,392 B2 | 4/2011 | Takafuji et al. | |
| 7,964,429 B2 | 6/2011 | Yamazaki et al. | |
| 2003/0172967 A1* | 9/2003 | Tachibana et al. | 136/244 |
| 2003/0178057 A1* | 9/2003 | Fujii et al. | 136/256 |
| 2004/0188680 A1* | 9/2004 | Nakajima et al. | 257/53 |
| 2005/0133084 A1* | 6/2005 | Joge et al. | 136/255 |
| 2006/0118164 A1* | 6/2006 | Montanini et al. | 136/261 |
| 2007/0235734 A1 | 10/2007 | Takafuji et al. | |
| 2007/0261731 A1* | 11/2007 | Abe et al. | 136/244 |
| 2008/0245406 A1* | 10/2008 | Yamazaki et al. | 136/252 |
| 2008/0251126 A1 | 10/2008 | Yamazaki et al. | |

FOREIGN PATENT DOCUMENTS

| | | |
|---|---|---|
| JP | 10-335683 A | 12/1998 |
| JP | 11-004008 A | 1/1999 |
| JP | 2001-089291 A | 4/2001 |
| JP | 2002-185024 | 6/2002 |
| JP | 2004-095661 A | 3/2004 |
| JP | 2004-288780 A | 10/2004 |
| JP | 2005-142282 A | 6/2005 |
| JP | 2005-268254 A | 9/2005 |
| JP | 2009-135464 A | 6/2009 |
| WO | 2009/057669 A1 | 5/2009 |

* cited by examiner

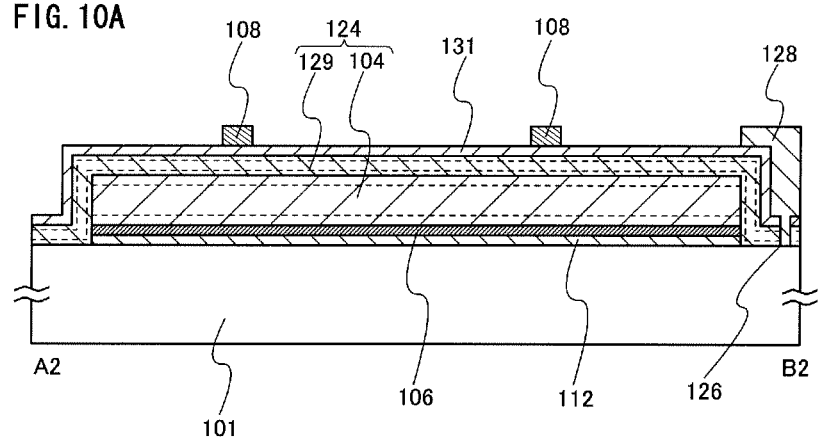
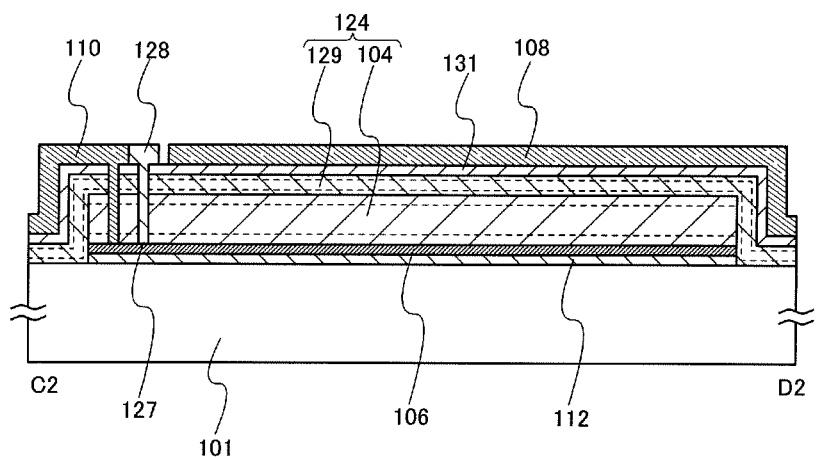

PHOTOELECTRIC CONVERSION DEVICE

BACKGROUND OF THE INVENTION

1. Field of the Invention

The present invention relates to photoelectric conversion devices which convert light energy into electrical energy using a photovoltaic effect of semiconductor and to a structure in which a plurality of photoelectric conversion cells are connected to each other.

2. Description of the Related Art

In a photoelectric conversion device in which a plurality of photoelectric conversion cells formed using a silicon wafer are arranged, photoelectric conversion cells are connected to each other with a strand or a flat wire. That is, an electrode on a light receiving plane which is provided on one surface of a silicon wafer, which is a component of a photoelectric conversion cell, is connected with a wiring component to a rear electrode which is provided on the opposite side of the silicon wafer.

Although a structure in which a plurality of photoelectric conversion cells are connected with a wiring component seems simple, a variety of ways have been devised to prevent deterioration of adhesion or disconnection defect of the wiring member over time. For example, a module is disclosed in which a wiring component is electrically connected to a photoelectric conversion cell body in a part of the module while a wiring component is mechanically connected to the photoelectric conversion cell body with an adhesive in another part of the module (see Patent Document 1). Further, an invention is disclosed in which the shape of a wiring member is devised in order to reduce a warp in the electric conversion cell and further to improve the reliability after connection (see Patent Document 2).

Patent Document

[Patent Document 1] Japanese Published Patent Application No. 2005-268254
[Patent Document 2] Japanese Published Patent Application No. 2005-142282

SUMMARY OF THE INVENTION

Connection between a plurality of photoelectric conversion cells with wiring components is complicated and a problem of connection failure of the wiring arises. In order to electrically connect the wiring components to the photoelectric conversion cell, use of a conductive material such as solder or conductive paste is needed. However, these conductive materials do not have sufficient adhesion. Therefore, there is a problem in that a connection part of the wiring components comes off from the photoelectric conversion cell.

Additionally, in order to connect neighboring photoelectric conversion cells with a wiring component in series, it is necessary to connect a light receiving plane of one photoelectric conversion cell and a rear plane of another photoelectric conversion cell, which inevitably causes inconvenience in arranging photoelectric conversion cells on a flat plane.

An object of the present invention is to simplify a process for manufacturing wirings which connect photoelectric conversion cells in a photoelectric conversion device. In addition, another object of the present invention is to prevent a defective rupture in the wiring connection of the photoelectric conversion cells.

One embodiment of the present invention is a photoelectric conversion device which includes at least a first photoelectric conversion cell and a second photoelectric conversion cell which are fixed on an upwards surface of a support substrate. The first photoelectric conversion cell includes a first single crystal semiconductor layer, a first electrode on a downwards surface of the first single crystal semiconductor layer which is a surface on the support substrate side, a second electrode provided on an upwards surface of the first single crystal semiconductor layer and a third electrode which is provided on the upwards surface and which is in contact with the first electrode through a through hole penetrating the first single crystal semiconductor layer. The second photoelectric conversion cell includes a second single crystal semiconductor layer, a fourth electrode on a downwards surface of the second single crystal semiconductor layer which is a surface on the support substrate side, a fifth electrode provided on an upwards surface of the second single crystal semiconductor layer, and a sixth electrode which is provided on the upwards surface and which is in contact with the fourth electrode through a through hole penetrating the second single crystal semiconductor layer. The second electrode is extended from the upwards surface of the first single crystal semiconductor layer to be connected to the sixth electrode situated on the upwards surface of the second single crystal semiconductor layer.

The photoelectric conversion cells are fixed on the support substrate and an opening is formed through a single crystal semiconductor layer of the photoelectric conversion cell, whereby an electrode of the photoelectric conversion cell and a wiring which connects photoelectric conversion cells can be integrated.

"Single crystals" are crystals whose crystal faces and crystal axes are aligned and whose atoms or molecules are spatially ordered. However, although single crystals are structured by orderly aligned atoms, single crystals do not exclude disorder such as a lattice defect in which the alignment is partially disordered or single crystals may include intended or unintended lattice distortion.

Note that a "damaged layer" refers to a region and its vicinity in which a single crystal semiconductor substrate is divided into a single crystal semiconductor layer and a separation substrate (a single crystal semiconductor substrate) during a division step. The states of the "damaged layer" vary according to a method used for forming the "damaged layer". For example, the "damaged layer" indicates a region which is weakened by local distortion of crystal structures. Note that a region between a surface of the single-crystal semiconductor substrate and the "damaged layer" is somewhat weakened in some cases. However, the "damaged layer" in this specification refers to a region and its vicinity at which the single crystal semiconductor substrate is divided later.

Ordinal numbers such as "first", "second", "third", and "fourth" which are used in description of the invention are given for convenience in order to distinguish elements, and they are not intended to limit the number of elements, the arrangement, nor the order of the steps.

According to one mode of the present invention, in connecting a plurality of photoelectric conversion cells in series or in parallel over a support substrate, through holes are provided in semiconductor layers, and then wiring to connect photoelectric conversion cells and the electrodes of the photoelectric conversion cells are formed in a same fabrication step, whereby a manufacturing process can be simplified. Additionally, a defective rupture in a wiring which connects photoelectric conversion cells can be prevented.

BRIEF DESCRIPTION OF THE DRAWINGS

FIGS. 10A and 10B are cross-sectional views of the photoelectric conversion device described in Embodiment 4.

DETAILED DESCRIPTION OF THE INVENTION

Figure 1:
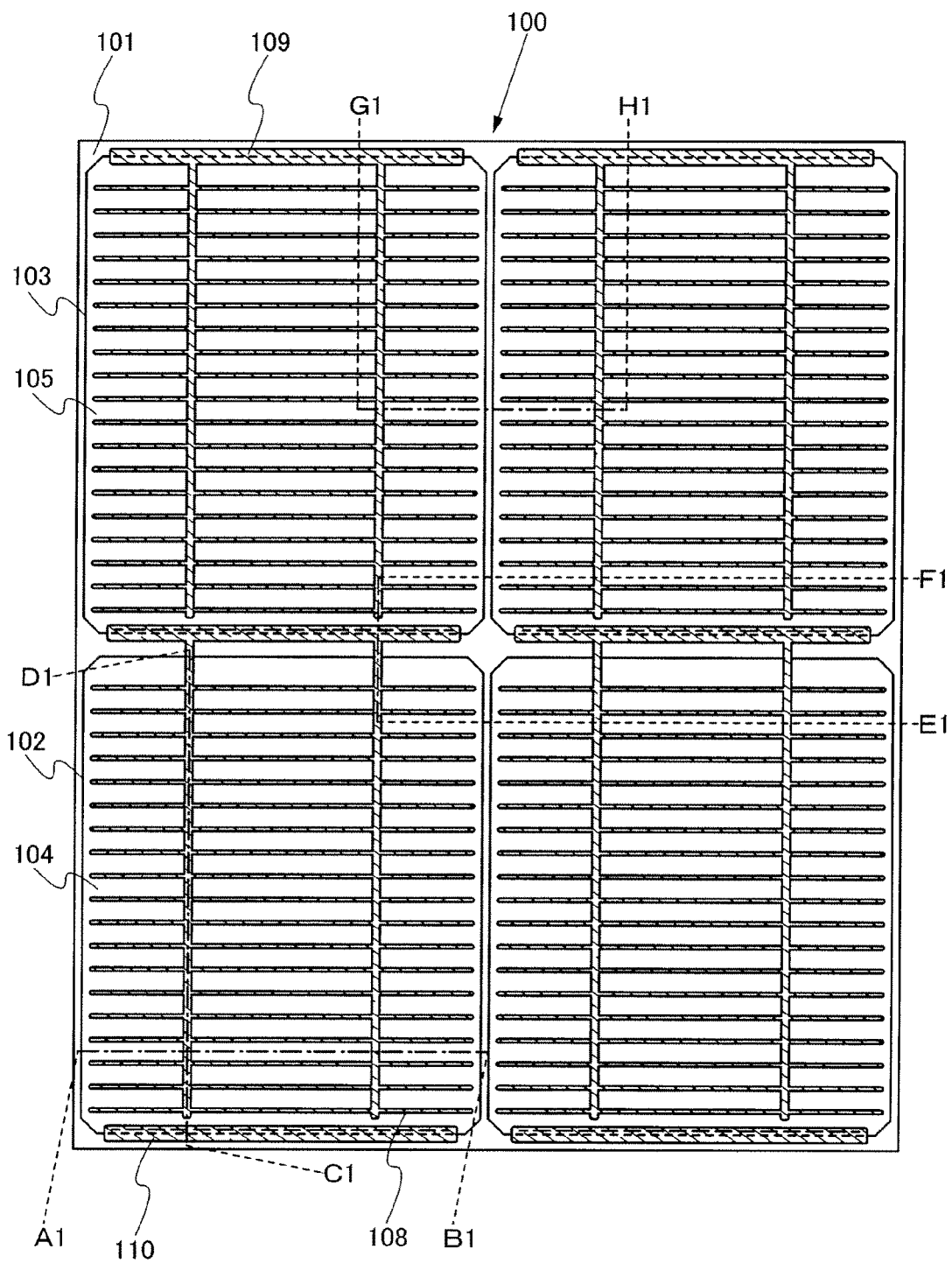
FIG. 1 is a plane view of a photoelectric conversion device described in Embodiment 1.

Embodiments of the disclosed invention will be described in detail with reference to the drawings. Note that the disclosed invention is not limited to the following description and it will be readily appreciated by those skilled in the art that modes and details can be modified in various ways without departing from the spirit and the scope of the present invention. Accordingly, the disclosed invention should not be construed as being limited to the description of the embodiments to be given below.

In embodiments described below, the same reference numerals may be used to denote the same components among different drawings. Note that elements in the accompanying drawings, that is, the thickness and width of layers, regions, and the like, the relative positional relationships between the components, and the like may be exaggerated for the sake of clarity of the description in the embodiments.

Embodiment 1

Figure 2A:
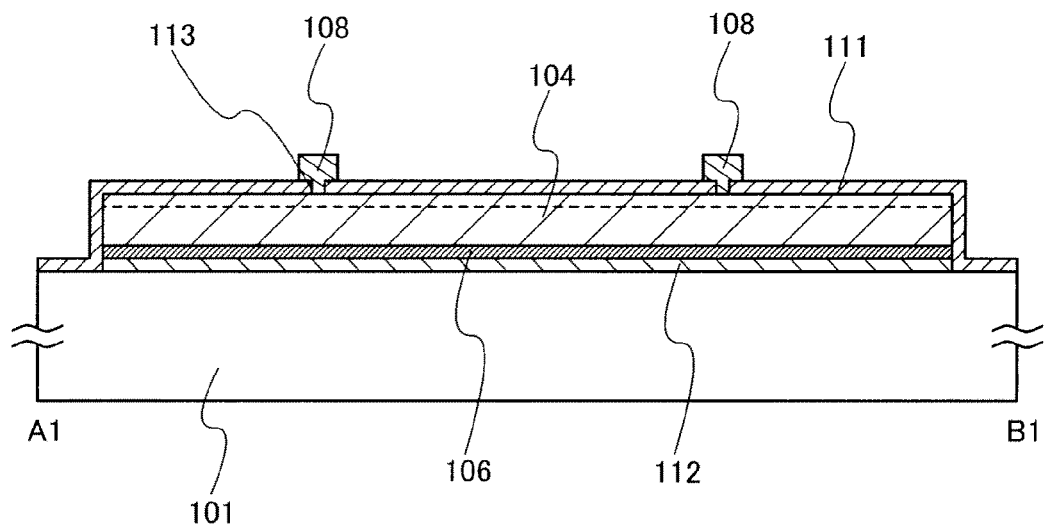
FIGS. 2A and 2B are cross-sectional views of the photoelectric conversion device described in Embodiment 1.
Figure 2B:
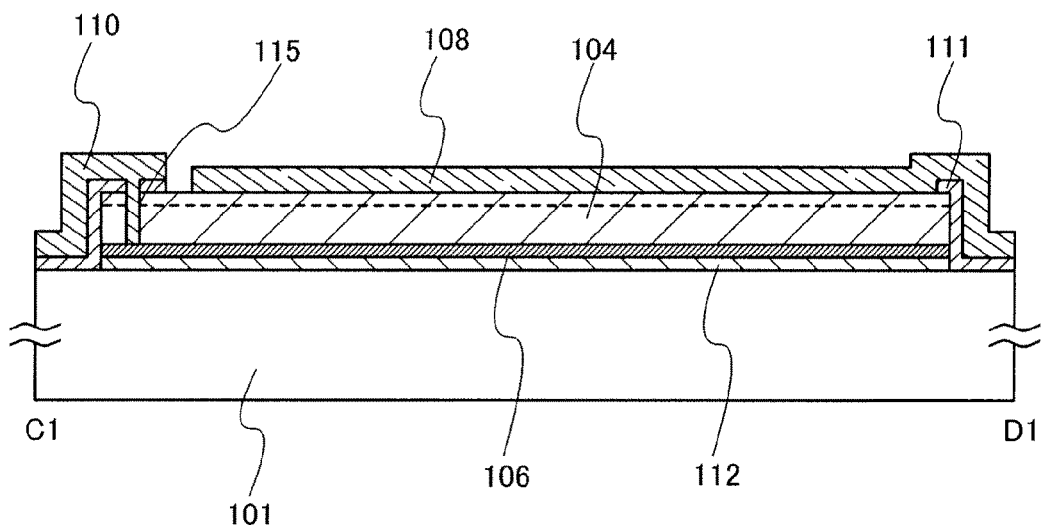
Figure 3A:
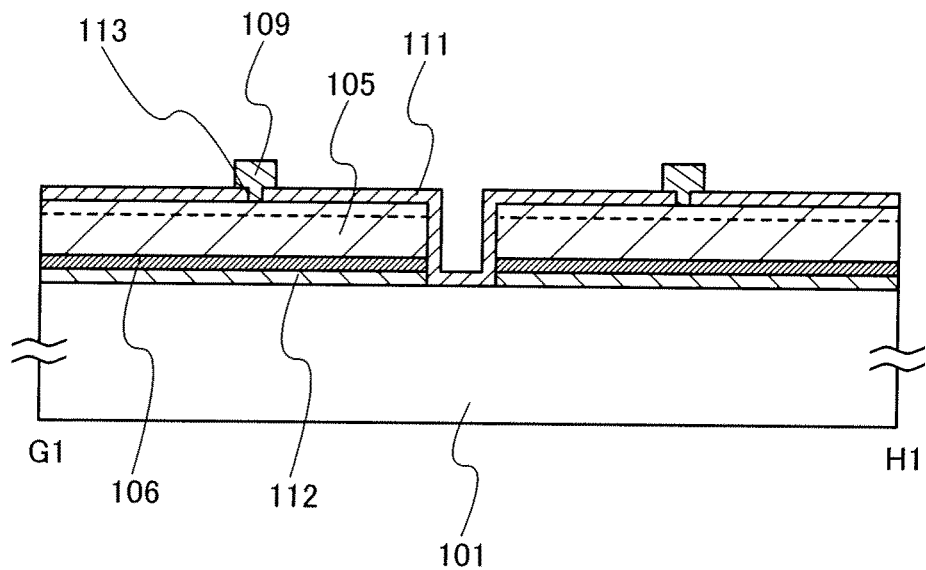
FIGS. 3A and 3B are cross-sectional views of the photoelectric conversion device described in Embodiment 1.
Figure 3B:
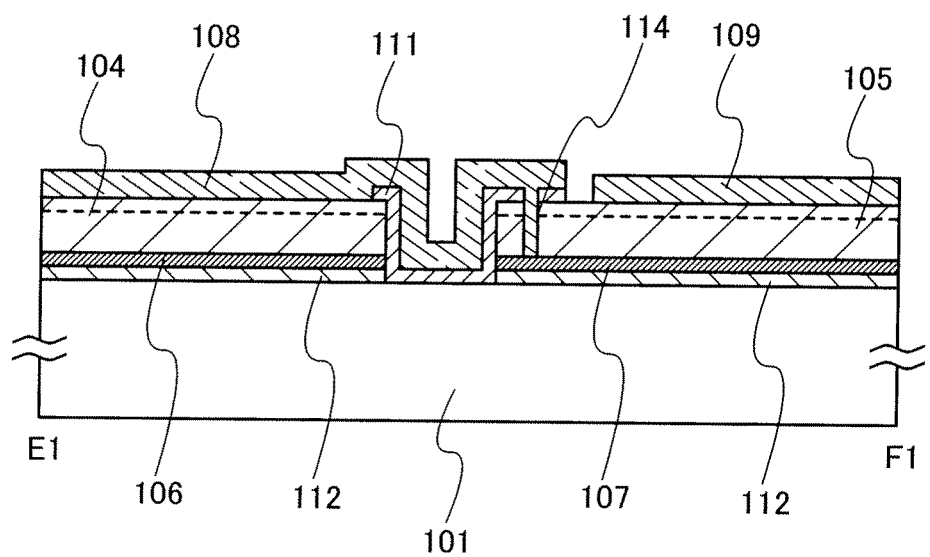

The photoelectric conversion device according to this embodiment will be described with reference to FIG. 1, FIGS. 2A and 2B, and FIGS. 3A and 3B. Here, FIG. 1 is a plane view of a photoelectric conversion device. FIGS. 2A and 2B are cross-sectional views taken along lines A1-B1 and C1-D1 of FIG. 1, respectively. FIGS. 3A and 3B are cross-sectional views taken along lines G1-H1 and E1-F1 of FIG. 1, respectively. This embodiment aims at simplifying a process for manufacturing a wiring connecting photoelectric conversion cells and/or at preventing a defective rupture in the wiring connecting the photoelectric conversion cells. The following description will be made with reference to those drawings.

A photoelectric conversion device 100 according to this embodiment includes a first photoelectric conversion cell 102 and a second photoelectric conversion cell 103 which are fixed over a support substrate 101. The support substrate 101 is a substrate with an insulating surface or an insulating substrate. It is for example particularly recommended to use any of a variety of glass substrates of the electronic industry such as aluminosilicate glass, aluminoborosilicate glass, or barium borosilicate glass. Further, chemically tempered glass or soda lime glass may be used.

The first photoelectric conversion cell 102 has a first single crystal semiconductor layer 104 which is provided with a first electrode 106 on the support substrate 101 side and a second electrode 108 on a surface opposite thereto. The first single crystal semiconductor layer 104 has a semiconductor junction such as a p-n junction or a p-i-n junction in order to have a photovoltaic effect. Also in the second photoelectric conversion cell 103, a second single crystal semiconductor layer 105 is provided with a first electrode 107 and a second electrode 109.

The first single crystal semiconductor layer 104 and the second single crystal semiconductor layer 105 are fixed to the support substrate 101 by a bonding layer 112. The bonding layer 112 is provided between the first electrode 106 and the support substrate 101 and between the first electrode 107 and the support substrate 101. The bonding layer 112 is formed from a thin film having a flat surface and hydrophilicity. A thin film which can be employed may be a thin film formed from an insulator such as silicon oxide, silicon nitride, aluminium oxide, or aluminium nitride.

The first single crystal semiconductor layer 104 and the second single crystal semiconductor layer IOS are formed by separating a thin piece from a single crystal semiconductor substrate. For example, the first single crystal semiconductor layer 104 and the second single crystal semiconductor layer IOs are formed by a hydrogen ion implantation separation method in such a manner that hydrogen ions are implanted at high concentration into a single crystal semiconductor substrate at a predetermined depth and then heat treatment is performed to separate a single crystal semiconductor layer of a surface portion. Alternatively, a method may be employed in which single crystal semiconductor is epitaxially grown on porous silicon, and then separated from a porous silicon layer by waterjet cleavage. As a single crystal semiconductor substrate, a single crystal silicon wafer is typically used. The thickness of the first single crystal semiconductor layer 104 and the second single crystal semiconductor layer 105 is 0.1 µm to 10 µm, inclusive, preferably 1 µm to 5 µm, inclusive. Since the single crystal semiconductor layer separated from the single crystal semiconductor substrate is fixed over the support substrate, the single crystal semiconductor layer can be prevented from being broken even with the thickness of 0.1 µm to 10 µm, inclusive. In the case of using a single crystal silicon semiconductor for the single crystal semiconductor layer, the single crystal semiconductor layer needs to have a thickness of the above range to absorb sunlight since single crystal silicon semiconductor has an energy gap of 1.12 eV and is of an indirect transition type.

The first single crystal semiconductor layer 104 and the second single crystal semiconductor layer 105 which are fixed to the support substrate 101 are covered with a protective layer 111. A transparent material is preferably used for the protective layer 111. The transparent material can be an insulating material such as silicon nitride, silicon oxide, aluminium oxide, or aluminium nitride or a conductive oxide material such as indium tin oxide, zinc oxide, or tin oxide. The protective layer 111 is provided to prevent the single crystal semiconductor layers from being directly exposed to air and to prevent entry of contaminants such as metal ions. In the case of providing the protective layer 111 in order to isolate neighboring photoelectric conversion cells as in this embodiment, an insulating material is preferably used as the transparent material.

The second electrodes 108 and 109 which are provided over the first single crystal semiconductor layer 104 and the second single crystal semiconductor layer 105, respectively, have a lattice-like shape (or a net-like shape). Openings 113 are provided in the protective layer 111 in accordance with the shapes of the second electrodes. The second electrode 108 and the second electrode 109 are in contact with the first single crystal semiconductor layer 104 and the second single crystal semiconductor layer 105 in the openings 113, respectively.

A through hole 114 which penetrates the protective layer 111 and the second single crystal semiconductor layer 105 and exposes the first electrode 107 is provided in order to connect the second electrode 108 and the first electrode 107. Electrical connection between the second electrode 108 and the first electrode 107 allows the first photoelectric conversion cell 102 and the second photoelectric conversion cell 103 to be connected in series. This connection structure does not employ a conventional wiring component. This connection structure can be made by extending the second electrode 108 over the first single crystal semiconductor layer 104.

Note that a second electrode 110 provided for the first single crystal semiconductor layer 104 is connected the first electrode 106 in the through hole 115. Therefore, the second electrode 110 serves as an electrode which leads the first electrode 106, which is not exposed on the surface, to the surface of the first single crystal semiconductor layer 104.

According to this embodiment, a wiring which electrically connects the first photoelectric conversion cell and the second photoelectric conversion cell is also provided in the same step of forming electrodes of the photoelectric conversion cells, whereby a manufacturing process can be simplified. A defective rupture in the wiring which connects the first photoelectric conversion cell and the second photoelectric conversion cell can be prevented. In other words, after the first photoelectric conversion cell and the second photoelectric conversion cell are fixed over the support substrate, the wiring which connects the two conversion cells is provided over the surface of the support substrate, thus, adhesion of the connection wiring can be enhanced.

Embodiment 2

Figure 5A:
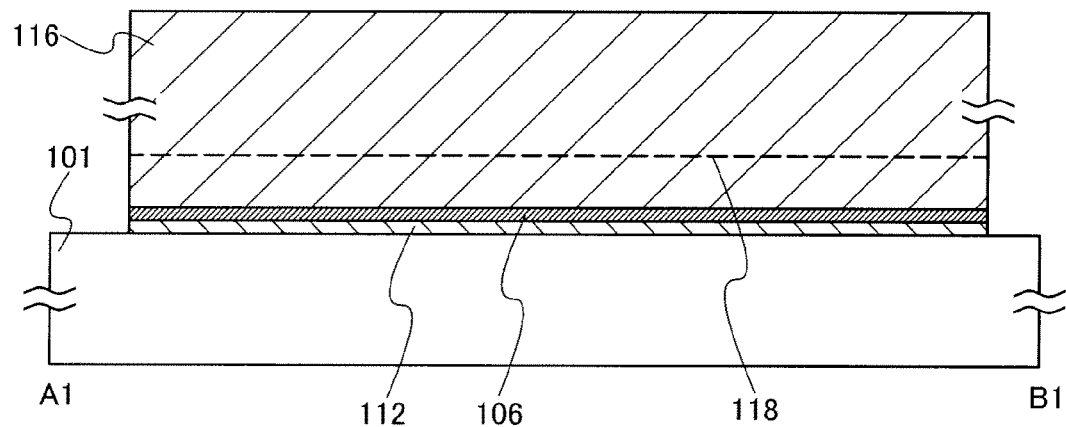
FIGS. 5A to 5C are cross-sectional views of steps of manufacturing the photoelectric conversion device described in Embodiment 2.
Figure 5B:
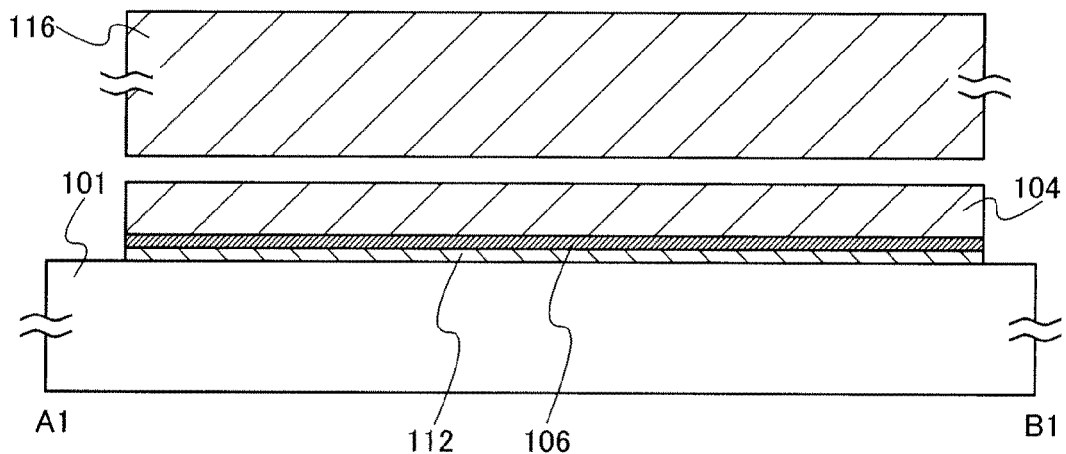
Figure 5C:
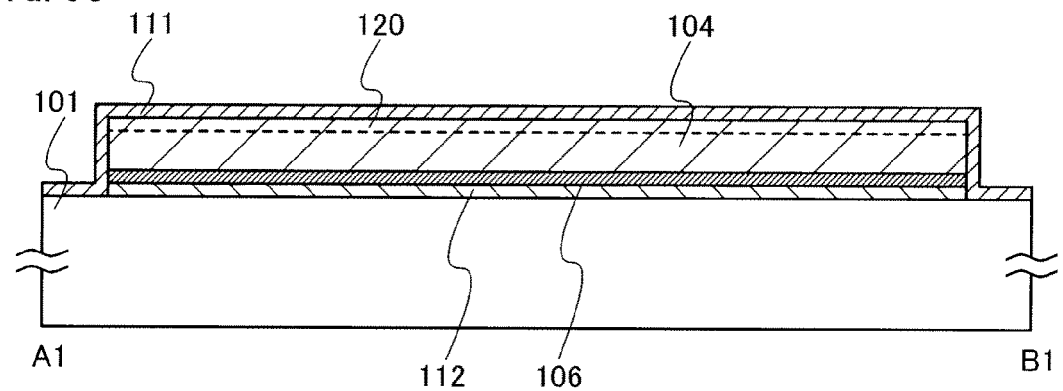
Figure 6A:
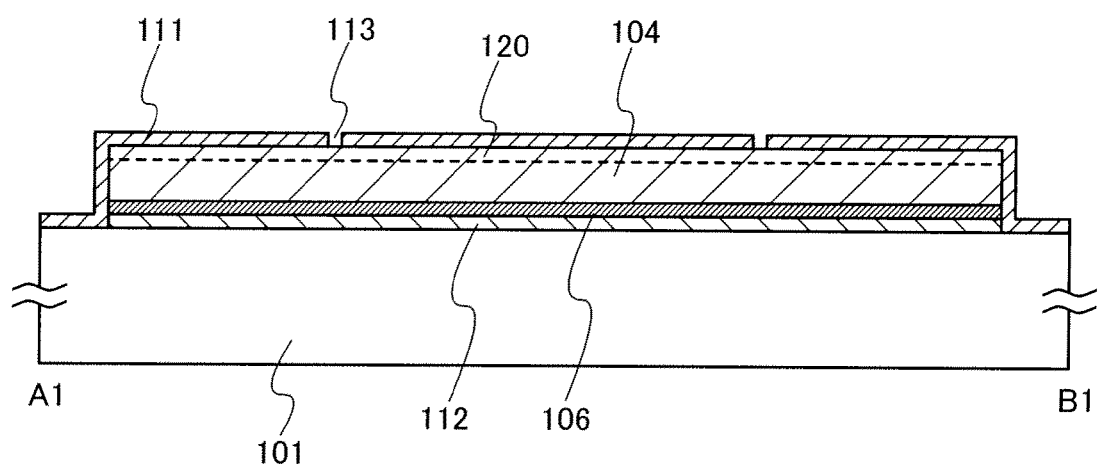
FIGS. 6A and 6B are cross-sectional views of a step of manufacturing the photoelectric conversion device described in Embodiment 2.
Figure 6B:
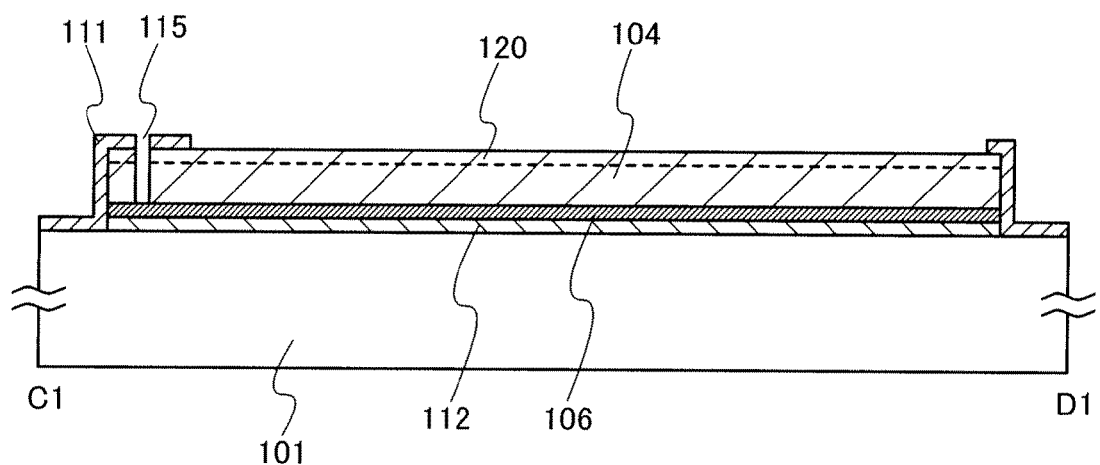

An example of a method for manufacturing the photoelectric conversion device described in Embodiment 1 will be described in this embodiment. In the following description, FIGS. 5A to 5C are cross-sectional views taken along line A1-B1 of FIG. 1; and FIGS. 6A and 6B are cross-sectional views taken along lines A1-B1 and C1-D1 of FIG. 1, respectively.

Figure 4A:
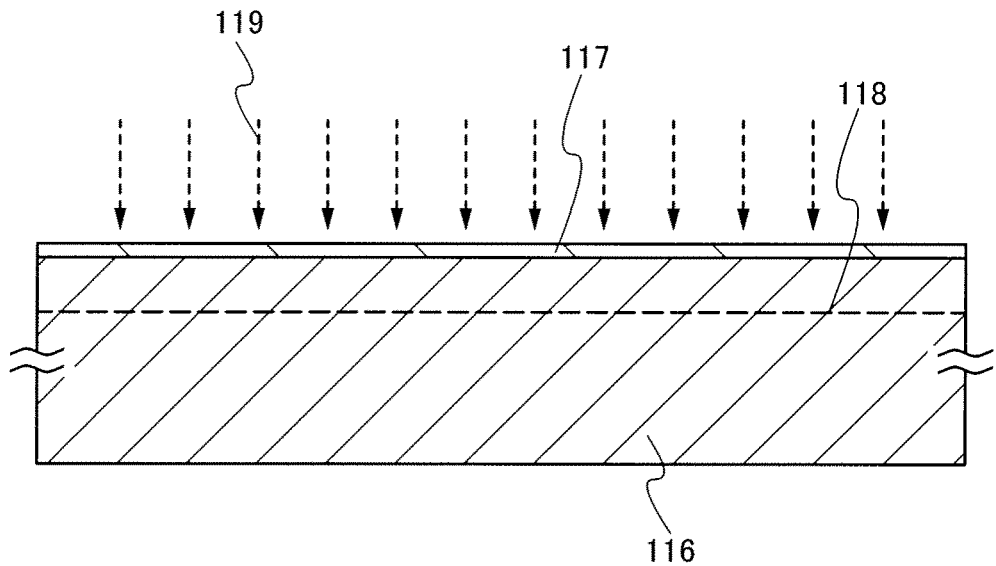
FIGS. 4A and 4B are cross-sectional views of steps of manufacturing a photoelectric conversion device described in Embodiment 2.

A semiconductor substrate 116 in FIG. 4A is single crystal semiconductor and has an approximately rectangular planar shape. The semiconductor substrate 116 is typically single crystal silicon. In addition, a surface of the semiconductor substrate 116 is preferably mirror polished so that the semiconductor substrate 116 can be closely attached to the support substrate with an insulating layer for bonding interposed therebetween. For example, a p-type single crystal silicon substrate with a resistance of about 1 Ωcm to 10 Ωcm is used as the semiconductor substrate 116.

A protective film 117 is formed from silicon oxide or silicon nitride. The protective film 117 is formed by a chemical vapor deposition method typified by a plasma CVD method. The semiconductor substrate 116 is preferably provided with the protection film 117 because the planarity of the surface of the semiconductor substrate 116 is lost due to irradiation with ions for forming a damaged layer in the semiconductor substrate 116. The protective film 117 preferably has a thickness of 50 nm to 200 nm.

Then, the surface which is provided with the protective film 117 of the semiconductor substrate 116 is irradiated with an ion beam 119 including hydrogen ions to form a damaged layer 118. Hydrogen cluster ions, for example $H_3^+$ ions are introduced as the hydrogen ions to form the damaged layer 118 at a predetermined depth from the surface. The depth of the damaged layer 118 is controlled by the acceleration energy of the hydrogen cluster ions. The thickness of the single crystal semiconductor layer to be separated from the semiconductor substrate 116 is determined by the depth of the damaged layer 118; therefore, the electric field intensity for accelerating the hydrogen cluster ions is determined in consideration of the thickness of the single crystal semiconductor layer to be separated. The damaged layer 118 is preferably formed at a depth of less than 10 μm, that is, 50 nm or more and less than 10000 nm, preferably 100 nm to 5000 nm from the surface of the semiconductor substrate 116.

Hydrogen cluster ions such as $H_3^+$ ions can be obtained by generating hydrogen plasma from an ion source which generates ions and extracting ions from the hydrogen plasma. The hydrogen plasma also includes ions such as $H_2^+$ ions and $H^+$ ions, in addition to $H_3^+$ ions. If the hydrogen plasma is generated when the pressure in the ion source is $1 \times 10^{-2}$ Pa to $5 \times 10^{-1}$ Pa, the rate of $H_3^+$ ions in the above three kinds of ions can be increased to 70% or higher.

Figure 4B:
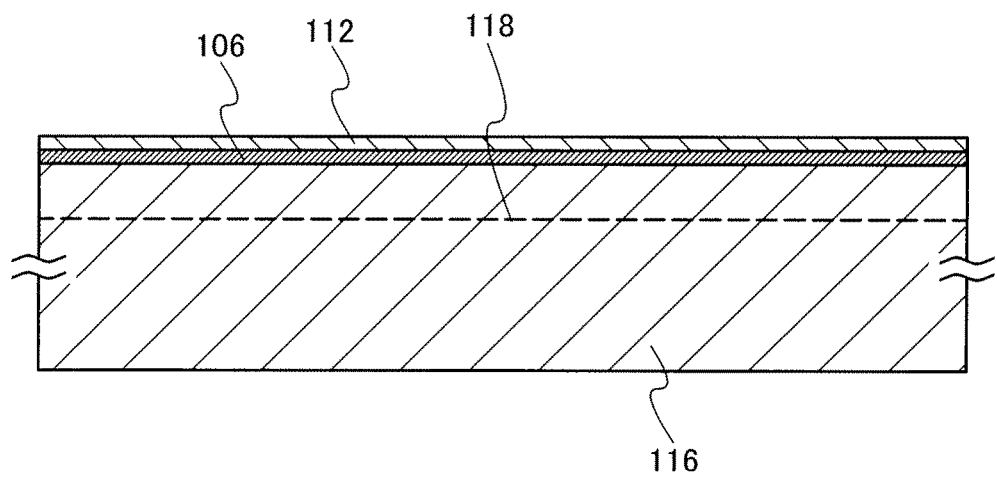

In FIG. 4B, the protective film 117 is removed and the first electrode 106 is formed over the semiconductor substrate 116. The first electrode 106 is preferably formed using a refractory metal. As the refractory metal, a metal material such as titanium, molybdenum, tungsten, tantalum, chromium, or nickel is used. The first electrode 106 may have a structure in which any of those metal materials and a nitride of the metal (a metal nitride) are stacked. In that case, by providing a metal nitride on the semiconductor substrate 116 side, the first electrode 106 can have a better adhesion to the semiconductor substrate 116.

The bonding layer 112 is formed over the first electrode 106. The bonding layer 112 is formed using a thin film formed from silicon oxide, silicon oxynitride, silicon nitride oxide, silicon nitride, or the like. It is necessary that the bonding layer 112 is smooth and has an average roughness Ra of 1 nm or less, preferably 0.5 nm or less. Note that the "average roughness" here refers to an average roughness obtained by three-dimensional expansion of a centerline average roughness which is defined by JIS B0601 (adhering to ISO 4287) so as to be able to be applied to a plane.

A preferable example of a thin film with such smoothness is a thin film of silicon oxide which is formed using organosilane by a chemical vapor deposition method. A thin film which is formed using organosilane, for example, a silicon oxide film can be used as the bonding layer 112. As organosilane, a silicon-containing compound such as tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) is used as a material and a thin film is formed by a plasma CVD method.

Alternatively, a silicon nitride film which is formed using a silane gas and an ammonia gas by a plasma CVD method can be used as the bonding layer 112. A thin film of silicon oxynitride or silicon nitride oxide can be obtained by a plasma CVD method using a silane gas, an ammonia gas, and a nitrogen oxide gas.

Note that the silicon oxynitride film refers to a film which contains more oxygen than nitrogen and contains oxygen, nitrogen, silicon, and hydrogen at concentrations ranging from 55 at. % to 65 at. %, 0.5 at. % to 20 at. %, 25 at. % to 35 at. %, and 0.1 at. % to 10 at. %, respectively (the percentages of oxygen, nitrogen, silicon, and hydrogen fall within the above ranges, when the total of atoms is 100 atomic %. The same applies in this paragraph). Further, a silicon nitride oxide film refers to a film which contains more nitrogen than oxygen and contains oxygen, nitrogen, silicon, and hydrogen at concentrations ranging from 15 at. % to 30 at. %, 20 at. % to 50 at. %, 25 at. % to 35 at. %, and 15 at. % to 25 at. %, respectively.

In FIG. 5A, the surface which is provided with the bonding layer 112 of the semiconductor substrate 116 is closely attached to the support substrate 101. When the support substrate 101 is closely attached to the bonding layer 112, the semiconductor substrate 116 is fixed over the support substrate 101 by hydrogen bonds or Van der Waals forces. If the surfaces of the support substrate 101 and the bonding layer 112 are hydrophilic, hydroxyl groups and water molecules effectively act to facilitate formation of hydrogen bonds. Further, if heat treatment is performed, water molecules are decomposed to form silanol groups (Si—OH) and hydrogen bonds are further increased. Even further, if heat treatment at a high temperature is performed, hydrogen atoms are released and siloxane bonds (O—Si—O) are formed to form covalent bonds, whereby the attachment strength of the semiconductor substrate 116 and the support substrate 101 is improved.

FIG. 5B illustrates a step in which heat treatment is performed and the first single crystal semiconductor layer 104 is separated from the semiconductor substrate 116 using the damaged layer 118. The heat treatment is performed at temperatures of 400° C. to 700° C. By this heat treatment, minute cavities formed in the damaged layer 118 change in volume and a crack occurs at the level of the damaged layer 118. Since the bonding layer 112 is bonded to the support substrate 101, the semiconductor substrate 116 can be separated from the support substrate 101 by this heat treatment while the first single crystal semiconductor layer 104 is left over the support substrate 101. The thickness of the first single crystal semiconductor layer 104 is 50 nm or more and less than 10000 nm, preferably 100 nm to 5000 nm. The thickness of the first single crystal semiconductor layer 104 can be controlled by the depth of the damaged layer 118.

After that, as illustrated in FIG. 5C, an impurity-containing semiconductor layer 120 which has a conductivity type opposite to that of the semiconductor substrate 116 is formed over the first single crystal semiconductor layer 104. The impurity-containing semiconductor layer 120 may be formed by adding an impurity element which serves as a donor or an acceptor to the first single crystal semiconductor layer 104 or by depositing a layer containing an impurity element which serves as a donor or an acceptor over the first single crystal semiconductor layer 104. The protective layer 111 is provided to cover the entire surface of the first single crystal semiconductor layer 104.

Then, the protective layer 111 is processed. FIG. 6A is a cross-sectional view taken along line A1-B1 of FIG. 1. The opening 113 is provided in the protective layer 111. Further, FIG. 6B is a cross-sectional view taken along line C1-D1 of FIG. 1. The through hole 115 is formed as well as the opening in the protective layer 111. The opening 113 in the protective layer 111 and the through hole 115 in the first single crystal semiconductor layer 104 are formed by irradiating the protective layer 111 and the first single crystal semiconductor layer 104 with a laser beam to subject them to a groove processing. Through the laser beam process, a groove with a width of 30 μm to 300 μm can be formed. In addition, even when the support substrate 101 has an increased size, the process can be easily performed.

As illustrated in FIGS. 2A and 2B, the second electrode 108 and the second electrode 110 are formed in accordance with the opening 113 and the through hole 115. The second electrode 108 is in contact with the impurity-containing semiconductor layer 120. The second electrode 110 is in contact with the first electrode 106 through the through hole 115.

Through the above steps, the photoelectric conversion device described in Embodiment 1 can be obtained. According to this embodiment, by utilizing a bonding technique, a single crystal semiconductor layer having a thickness of 10 μm or less can be provided over a support substrate such as a glass substrate at a process temperature of 700° C. or lower. Further, a wiring which electrically connects the first photoelectric conversion cell and the second photoelectric conversion cell is also provided in the same step of forming electrodes of the photoelectric conversion cells, whereby a manufacturing process can be simplified.

Embodiment 3

Figure 8A:
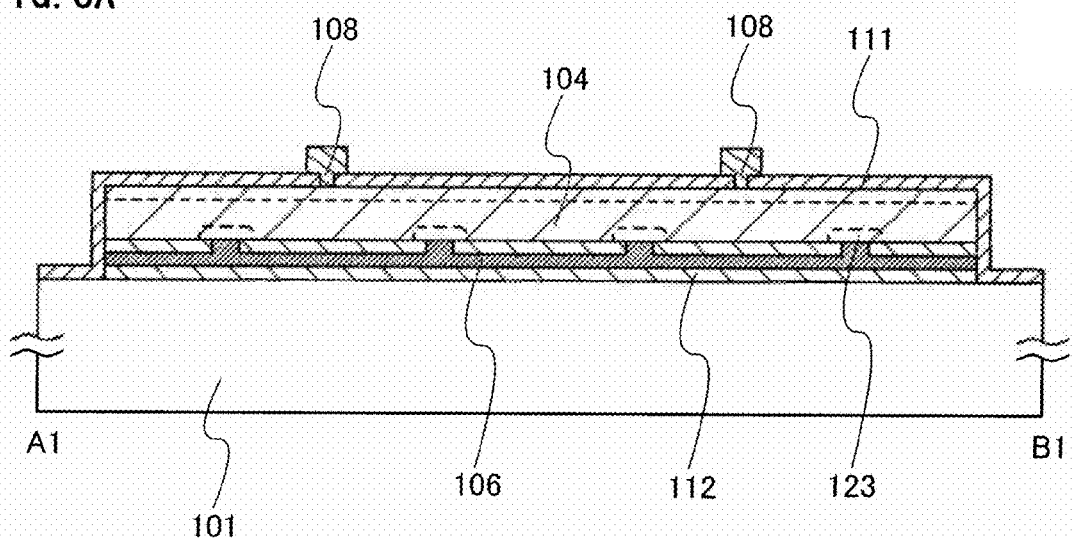
FIGS. 8A and 8B are cross-sectional views of a step of manufacturing the photoelectric conversion device described in Embodiment 3.
Figure 8B:
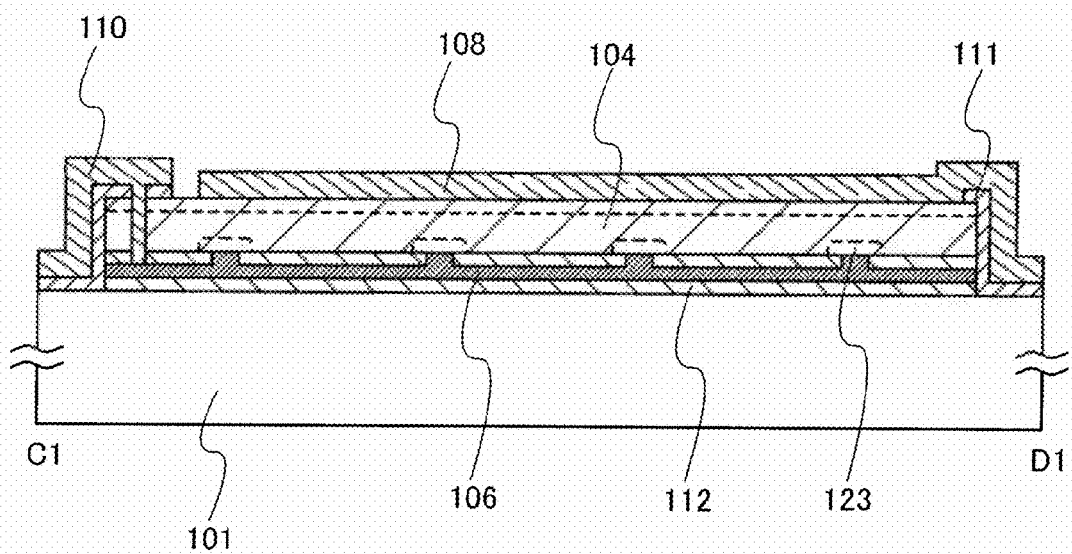

An example of a method for manufacturing the photoelectric conversion device described in Embodiment 1 will be described in this embodiment. The method in this embodiment is different from the method described in Embodiment 2. In the following description, FIGS. 8A and 8B are cross-sectional views taken along lines A1-B1 and C1-D1 of FIG. 1, respectively.

Figure 7A:
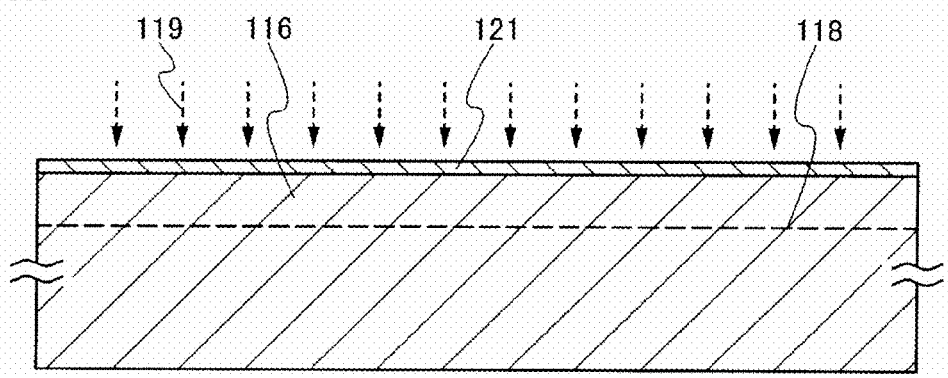
FIGS. 7A to 7C are cross-sectional views of steps of manufacturing a photoelectric conversion device described in Embodiment 3.

FIG. 7A illustrates formation of the damaged layer 118. In this embodiment, the semiconductor substrate 116 provided with a protective layer 121 is irradiated with the ion beam 119 including hydrogen ions, whereby the damaged layer 118 is formed. A silicon nitride film is preferably used as the protective layer 121 in order to suppress surface recombination.

Figure 7B:
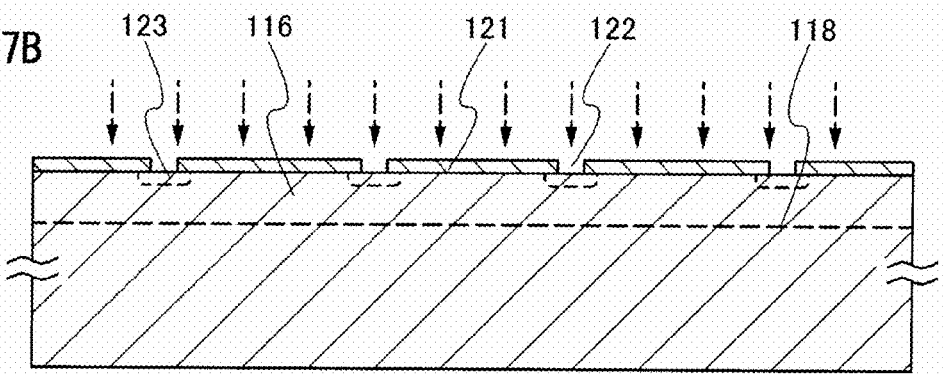

FIG. 7B illustrates formation of impurity-containing semiconductor layers 123. To the impurity-containing semiconductor layers 123, an impurity element which imparts the same conductivity type as the semiconductor substrate 116 is added in such a manner that the impurity concentration of the impurity-containing semiconductor layers 123 is higher than that of the semiconductor substrate 116. In that case, openings 122 are formed in the protective layer 121, and the impurity element is added through the openings with the protective layer 121 serving as a mask. Thus, the impurity-containing semiconductor layers 123 are discretely formed, whereby surface recombination of the protective layer 121 can be suppressed.

Figure 7C:
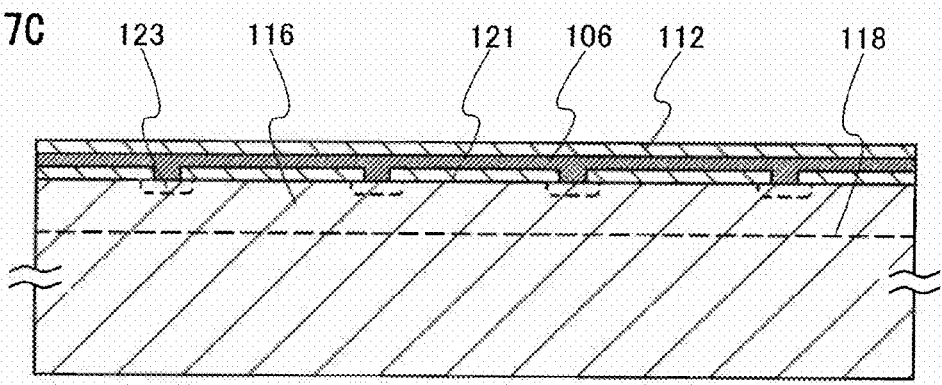

As illustrated in FIG. 7C, the first electrode 106 and the bonding layer 112 are formed. If the surface of the first electrode 106 is uneven due to the formation of openings in the protective layer 121, it is preferable to perform polishing treatment to flatten the surface after the first electrode 106 is formed.

After that, as illustrated in FIGS. 8A and 8B, the first single crystal semiconductor layer 104 is bonded to the support substrate 101, then, the protective layer 111, the second electrode 108, and the second electrode 110 are formed as in Embodiment 2.

Through the above steps, the photoelectric conversion device described in Embodiment 1 can be obtained. According to this embodiment, by utilizing a bonding technique, a single crystal semiconductor layer having a thickness of 10 µm or less can be provided over a support substrate such as a glass substrate at a process temperature of 700° C. or lower. Further, a wiring which electrically connects the first photoelectric conversion cell and the second photoelectric conversion cell is also provided in the same step of forming electrodes of the photoelectric conversion cells, whereby a manufacturing process can be simplified. Additionally, according to this embodiment, surface recombination of the single crystal semiconductor layer can be suppressed.

Embodiment 4

Figure 9:
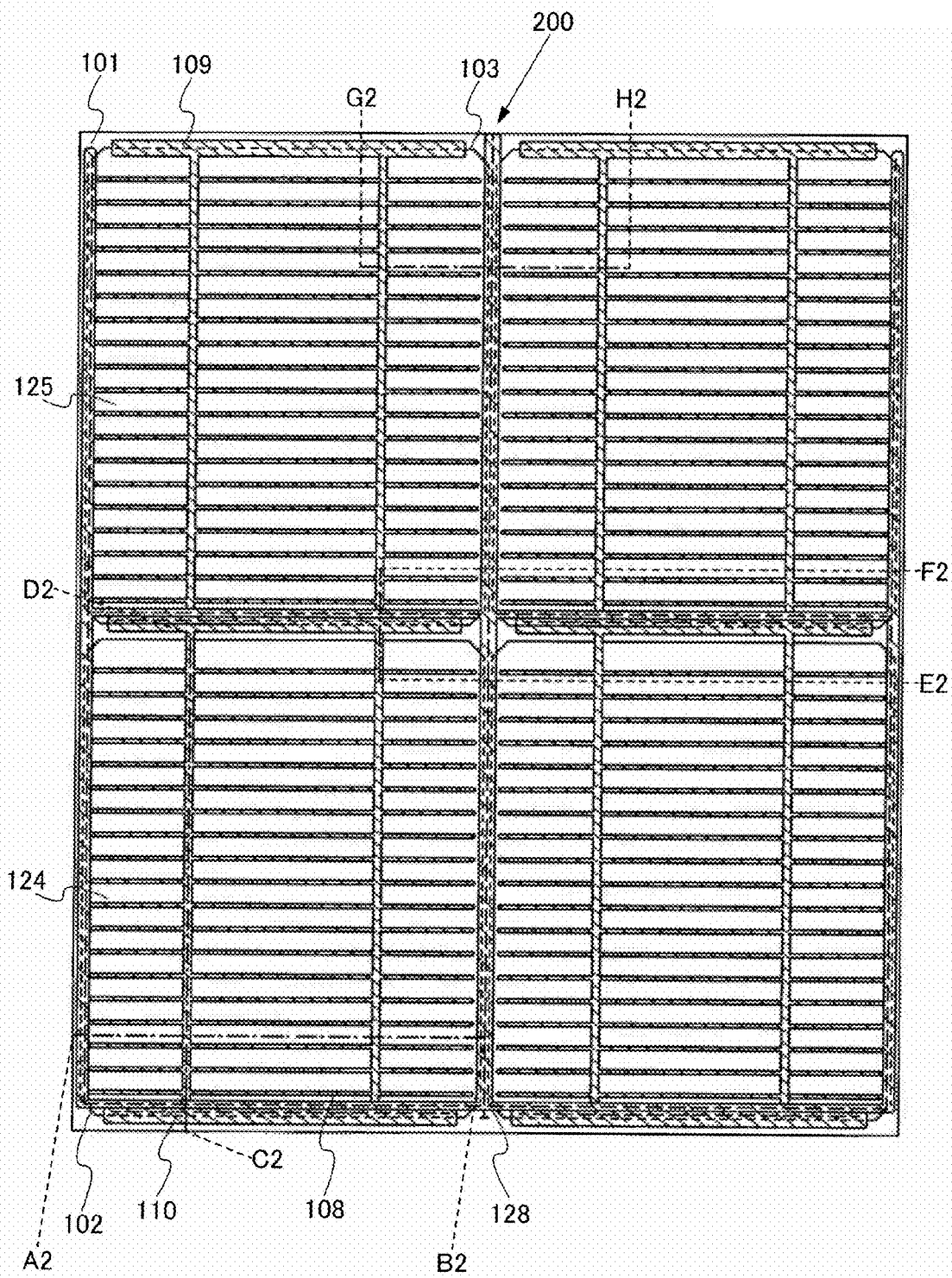
FIG. 9 is a plane view of a photoelectric conversion device described in Embodiment 4.
Figure 11A:
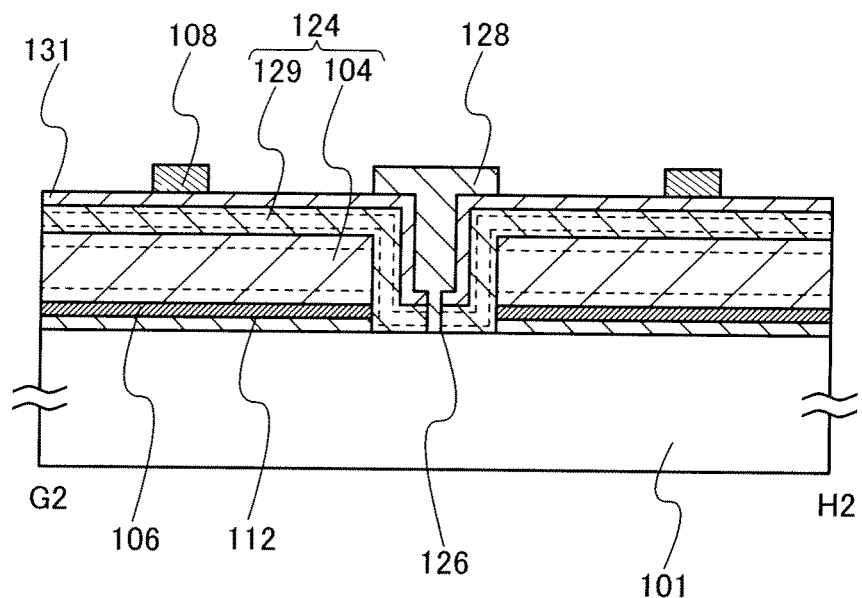
FIGS. 11A and 11B are cross-sectional views of the photoelectric conversion device described in Embodiment 4.
Figure 11B:
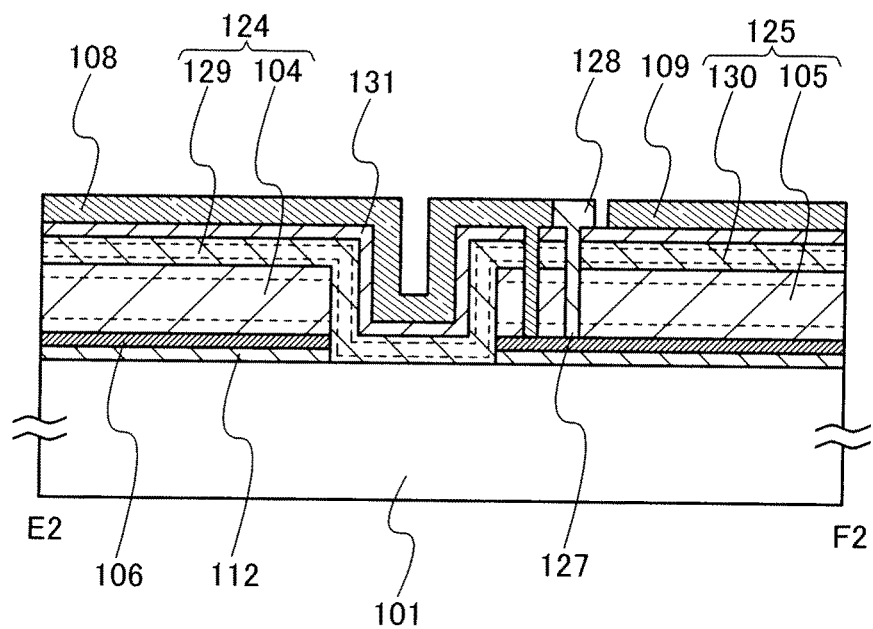

The photoelectric conversion device according to this embodiment will be described with reference to FIG. 9, FIGS. 10A and 10B, and FIGS. 11A and 11B. Here, FIG. 9 is a plane view of the photoelectric conversion device. FIGS. 10A and 10B are cross-sectional views taken along lines A2-B2 and C2-D2 of FIG. 9, respectively. FIGS. 11A and 11B are cross-sectional views taken along lines G2-H2 and E2-F2 of FIG. 9, respectively. In this embodiment, a photoelectric conversion cell which has the structure in Embodiment 1 and in which the semiconductor layer which conducts photoelectric conversion has stacked two layers will be described.

A photoelectric conversion device 200 according to this embodiment includes the first photoelectric conversion cell 102 and the second photoelectric conversion cell 103 which are fixed over the support substrate 101. The first photoelectric conversion cell 102 has a first stacked semiconductor layer 124 in which the first single crystal semiconductor layer 104 and a first non-single-crystal semiconductor layer 129 are stacked. The first single crystal semiconductor layer 104 has the first electrode 106 on the support substrate 101 side. A transparent electrode 131 is provided over the first non-single-crystal semiconductor layer 129. The transparent electrode 131 is formed from a transparent conductive material such as indium oxide, zinc oxide, or tin oxide. The second electrode 108 is provided over the transparent electrode 131. The second electrode 108 has a lattice-like shape (or a net-like shape) and is provided to compensate for sheet resistance of the transparent electrode 131.

Examples of non-single-crystal semiconductor materials which can be used to form the first non-single-crystal semiconductor layer 129 are amorphous silicon and microcrystal silicon. The first non-single-crystal semiconductor layer 129 has a structure in which a p-type and an n-type semiconductor layers sandwiches a semiconductor layer (an i-type semiconductor layer) having a lower dark conductivity than the p-type and the n-type semiconductor layers.

In the first stacked semiconductor layer 124 of this embodiment, a diode of the first single crystal semiconductor layer 104 and a diode of the first non-single-crystal semiconductor layer 129 are connected in series. Also in a second stacked semiconductor layer 125, a diode of the second single crystal semiconductor layer 105 and a diode of the second non-single-crystal semiconductor layer 130 are connected in series.

In the case where the energy gap of the first non-single-crystal semiconductor layer 129 is 1.75 eV, for example, the thickness of the first non-single-crystal semiconductor layer 129 is 200 nm to 400 nm. In the case where the energy gap of the first single crystal semiconductor layer 104 is 1.12 eV, the thickness of the first single crystal semiconductor layer 104 is 1 µm to 5 µm. In any case, the thickness of the first non-single-crystal semiconductor layer 129 and the first single crystal semiconductor layer 104 are determined so that their photoelectric current can be approximately the same. Thus, conversion efficiency can be maximized.

The first single crystal semiconductor layer 104 and the second single crystal semiconductor layer 105 are spaced over the support substrate 101 as in Embodiment 1. On the other hand, the first non-single-crystal semiconductor layer 129, the second non-single-crystal semiconductor layer 130, and the transparent electrode 131 are formed over the entire surface of the support substrate 101 by a thin film deposition method typified by a plasma CVD method or a sputtering method. Therefore, a separation groove 126 and a separation groove 127 are provided in order to isolate neighboring photoelectric conversion cells. The separation groove 126 penetrates the transparent electrode 131 and the first non-single-crystal semiconductor layer 129 to reach the support substrate 101. On the other hand, the separation groove 127 is provided to divide the transparent electrode 131 in order to connect the photoelectric conversion cells in series. The separation groove 127 may be formed to go through the second non-single-crystal semiconductor layer 130 but not to pierce the first electrode 107. An insulating layer 128 is formed to fill the separation groove 126 and the separation groove 127, which maintains isolation.

Note that as in Embodiment 1, the second electrode 108 provided over the first single crystal semiconductor layer 104 is connected to the first electrode 107 through the through hole 115. Thus, the first photoelectric conversion cell 102 and the second photoelectric conversion cell 103 are connected in series.

According to this embodiment, a wiring which electrically connects the first photoelectric conversion cell and the second photoelectric conversion cell is also provided in the same step of forming electrodes of the photoelectric conversion cells, whereby a manufacturing process can be simplified. A defective rupture in the wiring which connects the first photoelectric conversion cell and the second photoelectric conversion cell can be prevented.

This application is based on Japanese Patent Application serial No. 2008-229103 filed with Japan Patent Office on Sep. 5, 2008, the entire contents of which are hereby incorporated by reference.

What is claimed is:

1. A photoelectric conversion device comprising
    a support substrate;
    a first photoelectric conversion cell fixed on an upwards surface of the support substrate with a first insulating bonding layer interposed therebetween;
    a second photoelectric conversion cell fixed on the upwards surface of the support substrate with a second insulating bonding layer interposed therebetween; and
    a protective layer,
    wherein the first photoelectric conversion cell includes a first single crystal semiconductor layer, a first electrode on a downwards surface of the first single crystal semiconductor layer, and a second electrode on an upwards surface of the first single crystal semiconductor layer,
    wherein the second photoelectric conversion cell includes a second single crystal semiconductor layer, a third electrode on a downwards surface of the second single crystal semiconductor layer, and a fourth electrode on an upwards surface of the second single crystal semiconductor layer,
    wherein the fourth electrode extends from the upwards surface of the second single crystal semiconductor layer to be in direct contact with the first electrode through a through hole formed in the first single crystal semiconductor layer, wherein the fourth electrode comprises a conductive monolayer in direct contact with the upwards surface of the second single crystal semiconductor layer and with the first electrode in the through hole formed in the first single crystal semiconductor layer, and wherein the protective layer is interposed between the fourth electrode and both of a top portion and a side portion of the first single crystal semiconductor layer, and is in direct contact with the support substrate in a region between the first photoelectric conversion cell and the second photoelectric conversion cell.

2. The photoelectric conversion device according to claim 1, wherein thicknesses of the first single crystal semiconductor layer and the second single crystal semiconductor layer range from 0.1 µm to 10 µm.

3. The photoelectric conversion device according to claim 1, wherein the support substrate is a glass substrate.

4. The photoelectric conversion device according to claim 1, wherein the through hole is also formed in the protective layer.

5. The photoelectric conversion device according to claim 1,
wherein a side portion of the first electrode and the side portion of the first single crystal semiconductor layer are adjacent, and
wherein a side portion of the fourth electrode and a side portion of the second single crystal semiconductor layer are adjacent.

6. A photoelectric conversion device comprising:
a support substrate;
a first photoelectric conversion cell fixed on an upwards surface of the support substrate with a first insulating bonding layer interposed therebetween, the first photoelectric conversion cell including a first semiconductor layer, and a first conductive layer on a downwards surface of the first semiconductor layer;
a second photoelectric conversion cell fixed on the upwards surface of the support substrate with a second insulating bonding layer interposed therebetween, the second photoelectric conversion cell including a second semiconductor layer, and a second conductive layer on an upwards surface of the second semiconductor layer; and
a protective layer,
wherein the second conductive layer comprises a conductive monolayer in direct contact with the upwards surface of the second semiconductor layer and with the first conductive layer in a through hole formed in the first semiconductor layer, and
wherein the protective layer is interposed between the second conductive layer and both of a top portion and a side portion of the first semiconductor layer, and is in direct contact with the support substrate in a region between the first photoelectric conversion cell and the second photoelectric conversion cell.

7. The photoelectric conversion device according to claim 6, wherein a side portion of the first conductive layer and the side portion of the first semiconductor layer are adjacent to each other.

8. The photoelectric conversion device according to claim 6, wherein thicknesses of the first semiconductor layer and the second semiconductor layer range from 0.1 µm to 10 µm.

9. The photoelectric conversion device according to claim 6, wherein the support substrate is a glass substrate.

10. The photoelectric conversion device according to claim 6, wherein the through hole is also formed in the protective layer.

11. The photoelectric conversion device according to claim 6, wherein the first semiconductor layer is a single crystal semiconductor layer.

12. A photoelectric conversion device comprising:
a support substrate;
a first photoelectric conversion cell fixed on an upwards surface of the support substrate with a first insulating bonding layer interposed therebetween, the first photoelectric conversion cell including a first semiconductor layer, a second semiconductor layer stacked on the first semiconductor layer, and a first conductive layer on a downwards surface of the first semiconductor layer;
a second photoelectric conversion cell fixed on the upwards surface of the support substrate with a second insulating bonding layer interposed therebetween, the second photoelectric conversion cell including a third semiconductor layer, a fourth semiconductor layer stacked on the third semiconductor layer, and a second conductive layer on an upwards surface of the fourth semiconductor layer;
a third photoelectric conversion cell fixed on the upwards surface of the support substrate, in a location adjacent to the first photoelectric conversion cell; and
an insulating layer filling a first separation groove formed in the first semiconductor layer, the insulating layer electrically separating the second semiconductor layer from the fourth semiconductor layer and being formed over the first photoelectric conversion cell, the second photoelectric conversion cell, and the third photoelectric conversion cell,
wherein the first photoelectric conversion cell and the second photoelectric conversion cell are aligned along a first direction,
wherein the first photoelectric conversion cell and the third photoelectric conversion cell are aligned along a second direction, different from the first direction,
wherein the second conductive layer is in direct contact with the first conductive layer through a through hole formed in the first semiconductor layer and the second semiconductor layer, and
wherein the insulating layer is in direct contact with the support substrate in a region located between the first photoelectric conversion cell and the third photoelectric conversion cell through a second groove so as to separate electrically the first photoelectric conversion cell from the third photoelectric conversion cell.

13. The photoelectric conversion device according to claim 12, wherein a side portion of the first conductive layer and a side portion of the first semiconductor layer are adjacent to each other.

14. The photoelectric conversion device according to claim 12, wherein the support substrate is a glass substrate.

15. The photoelectric conversion device according to claim 12, wherein the first semiconductor layer is a single crystal semiconductor layer.

16. The photoelectric conversion device according to claim 12, wherein the second semiconductor layer is a non-single crystal semiconductor layer.

17. The photoelectric conversion device according to claim 12,
wherein the first semiconductor layer is a single crystal semiconductor layer, and
wherein the second semiconductor layer is a non-single crystal semiconductor layer.

18. The photoelectric conversion device according to claim 12, wherein the second conductive layer extends from the upwards surface of the fourth semiconductor layer to an upwards surface of the second semiconductor layer.

19. The photoelectric conversion device according to claim 12, wherein the second conductive layer extends from an upwards surface of the second semiconductor layer to an upwards surface of the first semiconductor layer and is in direct contact with the first conductive layer.

* * * * *